(12) United States Patent
Itoh (10) Patent No.: US 7,855,561 B2
(45) Date of Patent: Dec. 21, 2010

(54) TEST CIRCUIT (75) Inventor: Kenichi Itoh, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 107 days.

(21) Appl. No.: 12/318,235

(22) Filed: Dec. 23, 2008

(65) Prior Publication Data
US 2010/0052694 A1 Mar. 4, 2010

(30) Foreign Application Priority Data
Sep. 1, 2008 (JP) ............................. 2008-223550

(51) Int. Cl.
*G01R 31/08* (2006.01)
(52) U.S. Cl. ...................... 324/535; 324/765; 324/527; 324/532
(58) Field of Classification Search ................. 324/765, 324/527, 532, 535, 555
See application file for complete search history.

(56) References Cited

U.S. PATENT DOCUMENTS

| | | | |
|---|---|---|---|
| 7,237,081 B2 * | 6/2007 | Dahan et al. ................ | 711/163 |
| 7,246,287 B1 * | 7/2007 | Chua-Eoan et al. ......... | 714/733 |
| 2003/0140244 A1 * | 7/2003 | Dahan et al. ................ | 713/200 |
| 2003/0140245 A1 * | 7/2003 | Dahan et al. ................ | 713/200 |
| 2003/0221152 A1 * | 11/2003 | Volkerink et al. .......... | 714/736 |
| 2004/0123118 A1 * | 6/2004 | Dahan et al. ................ | 713/189 |
| 2005/0144497 A1 * | 6/2005 | Song et al. .................. | 713/503 |
| 2007/0247936 A1 * | 10/2007 | Direnzo et al. ............. | 365/200 |

FOREIGN PATENT DOCUMENTS

| | | |
|---|---|---|
| JP | 11-212816 A | 8/1999 |
| JP | 2003-194886 A | 7/2003 |
| JP | 2005-241287 A | 9/2005 |
| JP | 2006-119023 | 5/2006 |

OTHER PUBLICATIONS

Japanese Office Action dated Mar. 3, 2009 with Partial English-Language Translation.

* cited by examiner

*Primary Examiner*—Lincoln Donovan
*Assistant Examiner*—Adam D Houston
(74) *Attorney, Agent, or Firm*—McGinn IP Law Group, PLLC (57) ABSTRACT

A test circuit according to the present invention includes: a synthesis circuit that synthesizes a first test result signal output from a first test target circuit in response to a test instruction, and a second test result signal output from a second test target circuit in response to the test instruction; an inter-block delay generation circuit that delays the second test result signal with respect to the first test result signal; and a test result holding circuit that holds a synthesized test result signal every predetermined timing, the synthesized test result signal being output from the synthesis circuit.

15 Claims, 8 Drawing Sheets

TEST CIRCUIT

BACKGROUND

1. Field of the Invention

The present invention relates to a test circuit, and more particularly, to a test circuit that receives test results from a plurality of test target circuits.

2. Description of Related Art

In recent years, an increasing number of functions are implemented in a single application specific integrated circuit (ASIC). Thus, the number of circuit blocks and the size of the ASIC have been increased. To test such a large number of circuit blocks, the ASIC typically includes a test circuit having a scan chain circuit mounted therein. The use of the scan chain circuit enables testing of a large number of circuit blocks with a small number of terminals.

When a circuit block is added subsequently, however, the added block may be excluded from test targets of the scan chain circuit. In this case, it is necessary to separately provide a terminal for the added circuit block, which causes a problem of an increase in the number of terminals of the ASIC. In this regard, Japanese Unexamined Patent Application Publication No. 2006-119023 discloses a method of testing a circuit block excluded from test targets of a scan chain circuit without increasing the number of terminals.

Japanese Unexamined Patent Application Publication No. 2006-119023 discloses a technique in which a micro processing unit (MPU) mounted on the ASIC tests the circuit block excluded from the test targets of the scan chain circuit and receives the test results. According to the technique disclosed in Japanese Unexamined Patent Application Publication No. 2006-119023, the circuit block excluded from the test targets of the scan chain circuit can be tested without increasing the number of terminals.

SUMMARY

The present inventor has found that the following problem. If the number of circuit blocks excluded from the test targets of the scan chain circuit is increased, however, there arises a problem in that the load of the MPU greatly increases. Specifically, to transmit a test instruction to each of a plurality of circuit blocks and to receive test results from the plurality of circuit blocks, it is necessary for the MPU to execute polling to each of the circuit blocks or to execute interrupt handler processing so as to smoothly perform each processing.

One aspect of an embodiment of the present invention is a test circuit including: a synthesis circuit that synthesizes a first test result signal output from a first test target circuit in response to a test instruction, and a second test result signal output from a second test target circuit in response to the test instruction; an inter-block delay generation circuit that delays the second test result signal with respect to the first test result signal; and a test result holding circuit that holds a synthesized test result signal every predetermined timing, the synthesized test result signal being output from the synthesis circuit.

According to the test circuit of the present invention, the first test result signal and the second test result signal having a delay time with respect to the first test result signal are synthesized to obtain the synthesized test result signal. Thus, it is possible to identify which of the first test result signal and the second test result signal has a failure based on the waveform of the synthesized test result signal, when the first test result signal or the second test result signal has a failure. In other words, according to the test circuit of the present invention, information about the circuit block in which a malfunction has occurred is contained in a single synthesized test result signal, and thus, the circuit block in which a malfunction has occurred can be identified without reading each of the test results of the plurality of circuit blocks.

According to the test circuit of the present invention, it is possible to identify the circuit block in which a malfunction has occurred from among a plurality of circuit blocks, based on a single synthesized test result signal.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Hereinafter, exemplary embodiments of the present invention will be described with reference to the accompanying drawings. While an example is described below in which a test circuit and test target circuits are incorporated into a single semiconductor device, the test circuit according to an exemplary embodiment of the present invention may be provided separately from the test target circuits.

Figure 1:
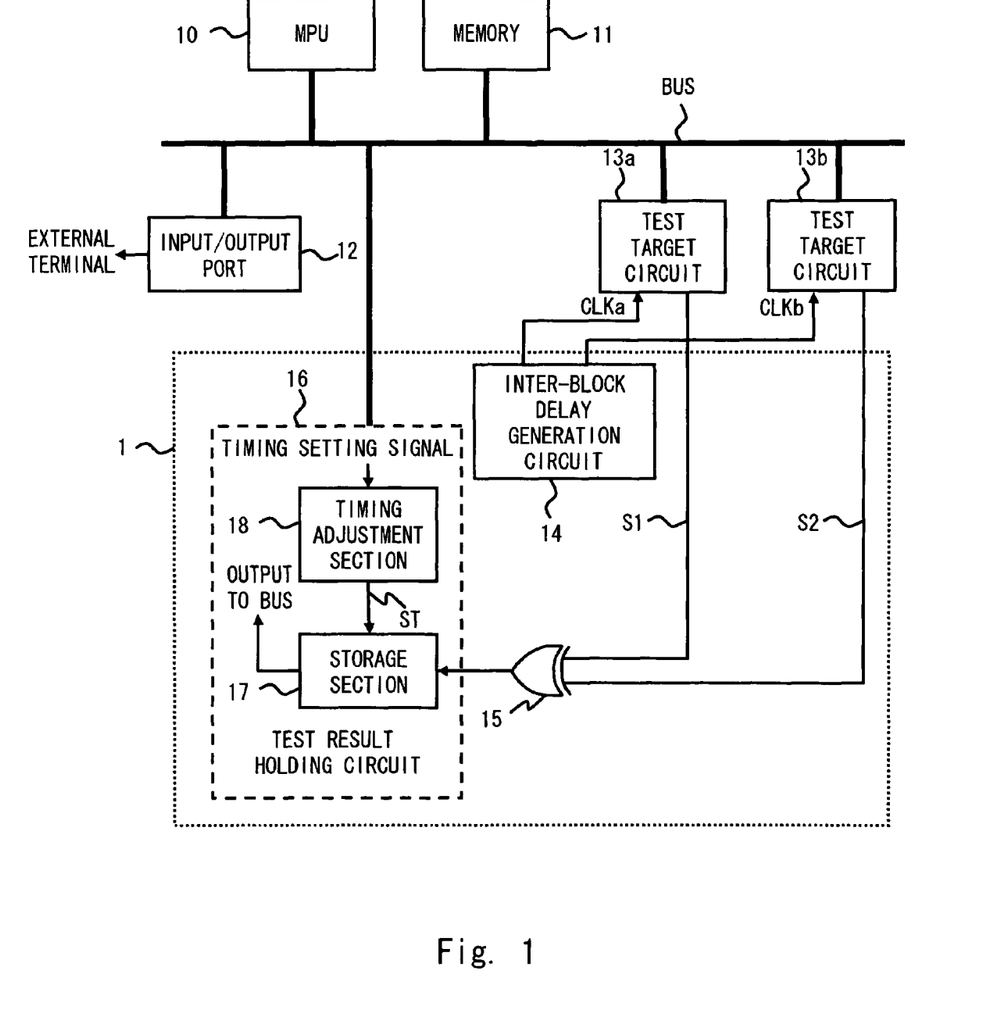
FIG. 1 is a block diagram of a semiconductor device according to a first exemplary embodiment of the present invention.

FIG. 1 shows a block diagram of a semiconductor device including a test circuit 1 according to an exemplary embodiment of the present invention. Referring to FIG. 1, the semiconductor device includes the test circuit 1, a micro processing unit (MPU) 10, a memory 11, an input/output port 12, and test target circuits 13a and 13b. The MPU 10, the memory 11, the input/output port 12, the test target circuits 13a and 13b, and the test circuit 1 are connected to one another via buses. Further, the test circuit 1 includes an inter-block delay generation circuit 14, a synthesis circuit 15, and a test result holding circuit 16.

The MPU 10 executes signal processing according to a program read from the memory 11 or a program received via the input/output port 12. The memory 11 stores the programs processed in the MPU 10, results of the signal processing executed by the MPU 10, and results of processing executed by other circuits. The input/output port 12 is connected to an external terminal (not shown) of the semiconductor device, and inputs/outputs signals to/from the outside of the semiconductor device.

The test target circuits 13a and 13b are, for example, functional blocks that execute various processing in response to an instruction from the MPU 10. In the first exemplary embodiment of the present invention, illustration of the other functional blocks is omitted. It is assumed that the test target circuits 13a and 13b are not tested by a scan chain circuit for testing the other functional blocks. The test target circuit 13a receives a test instruction from the MPU 10 and outputs a first test result signal S1. The test target circuit 13b receives the test instruction from the MPU 10 and outputs a second test result signal S2.

The inter-block delay generation circuit 14 supplies operation clocks having difference phases to the test target circuits 13a and 13b. Hereinafter, the operation clocks are respectively referred to as "operation clock CLKa" and "operation clock CLKb". The test target circuits 13a and 13b operate at different timings in synchronization with the operation clocks CLKa and CLKb, respectively, and output test result signals having different phases.

The synthesis circuit 15 synthesizes the first test result signal S1 and the second test result signal S2, and outputs a synthesized test result signal. According to an exemplary embodiment of the present invention, an exclusive OR circuit is used as the synthesis circuit 15. Thus, the synthesized test result signal corresponds to a result of an exclusive OR operation on the first test result signal S1 and the second test result signal S2.

The test result holding circuit 16 holds the synthesized test result signal every predetermined timing. Specifically, the test result holding circuit 16 includes a storage section 17 and a timing adjustment section 18. The timing adjustment section 18 receives a timing setting signal from the MPU 10 via a bus, and outputs a trigger signal ST. The trigger signal ST is, for example, a pulse signal having a predetermined cycle. The storage section 17 stores a logical value of the synthesized test result signal in synchronization with the rising edge of the trigger signal ST. Further, the storage section 17 outputs the stored test result in response to the read instruction from the MPU 10.

Figure 2:
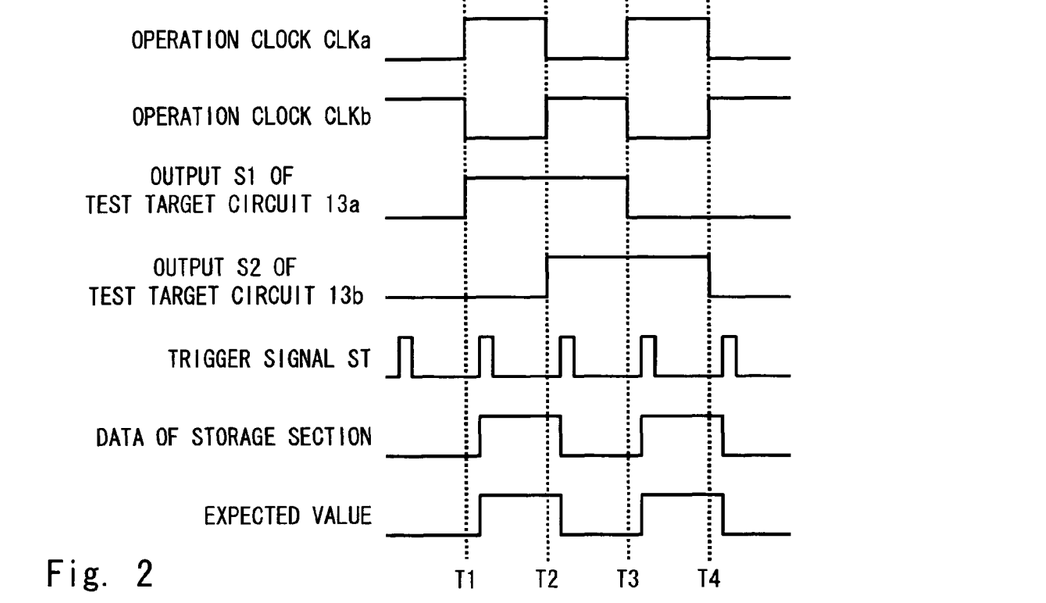
FIG. 2 is a timing diagram showing an operation of a test circuit according to the first exemplary embodiment of the present invention.
Figure 3:
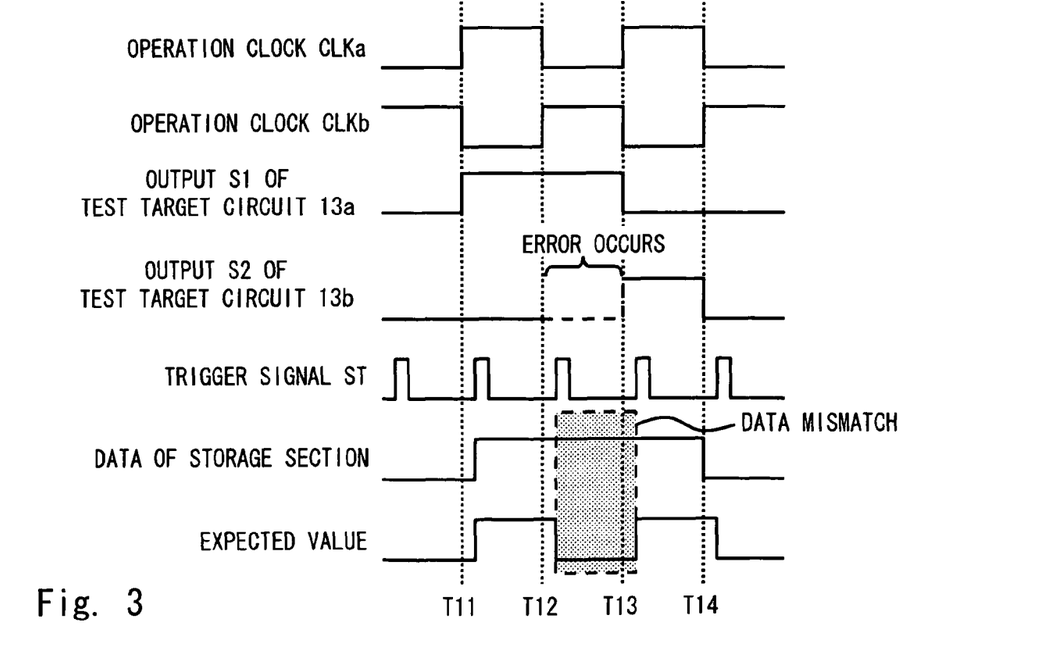
FIG. 3 is a timing diagram showing an operation of the test circuit according to the first exemplary embodiment of the present invention.

Next, a description is given of a test operation using the test circuit according to an exemplary embodiment of the present invention. FIG. 2 shows a timing diagram of the test operation in the case where no malfunction has occurred in both the test target circuits 13a and 13b. Further, FIG. 3 shows a timing diagram of the test operation in the case where a malfunction 5 has occurred in the test target circuit 13a. It is assumed herein that the test target circuits 13a and 13b receive the test instruction from the MPU 10 before starting the test, and start the operation simultaneously with the start of input of the operation clocks. Further, according to an exemplary embodiment of the present invention, it is assumed that the phase of the operation clock CLKb generated by the inter-block delay generation circuit 14 is delayed from the phase of the operation clock CLKa by 180°.

First, referring to FIG. 2, a description is given of the test operation in the case where no malfunction has occurred in both the test target circuits 13a and 13b. In the example shown in FIG. 2, the first test result signal S1 output from the test target circuit 13a rises in response to a rising edge of the operation clock CLKa at a timing T1. Then, the trigger signal ST rises with a delay from the timing T1, and a signal obtained by synthesizing the first test result signal S1 and the second test result signal S2, which are output at the timing T1, is stored in the storage section 17 as the synthesized test result signal. In this case, the data stored in the storage section 17 is at high level, since the first test result signal S1 is at high level and the second test result signal S2 is at low level.

Then, the second test result signal S2 output from the test target circuit 13b rises in response to a rising edge of the operation clock CLKb at a timing T2. Further, the trigger signal ST rises with a delay from the timing T2, and a signal obtained by synthesizing the first test result signal S1 and that second test result signal S2, which are output at the timing T2, is stored in the storage section 17 as the synthesized test result signal. In this case, the data stored in the storage section 17 is at low level, since the first test result signal S1 is at high level and the second test result signal S2 is at high level.

Then, the first test result signal S1 output from the test target circuit 13a falls in response to a rising edge of the operation clock CLKa at a timing T3. Further, the trigger signal ST rises with a delay from the timing T3, and a signal obtained by synthesizing the first test result signal S1 and the second test result signal S2, which are output at the timing T3, is stored in the storage section 17 as the synthesized test result signal. In this case, the data stored in the storage section 17 is at high level, since the first test result signal S1 is at low level and the second test result signal S2 is at high level.

Then, the second test result signal S2 output from the test target circuit 13b falls in response to a rising edge of the operation clock CLKb at a timing T4. Further, the trigger signal ST rises with a delay from the timing T4, and a signal obtained by synthesizing the first test result signal S1 and the second test result signal S2, which are output at the timing T4, is stored in the storage section 17 as the synthesized test result signal. In this case, the data stored in the storage section 17 is at low level, since the first test result signal S1 is at low level and the second test result signal S2 is at low level.

After that, the synthesized test result signal stored in the storage section 17 is read out in response to the read instruction from the MPU 10, and is collated with an expected value prepared in advance. In the example shown in FIG. 2, the expected value matches the synthesized test result signal. Accordingly, it is determined that no malfunction has occurred in the test target circuits 13a and 13b.

Next, referring to FIG. 3, a description is given of the test operation in the case where a malfunction has occurred in the test target circuit 13b. In the example shown in FIG. 3, the first test result signal S1 output from the test target circuit 13a rises in response to a rising edge of the operation clock CLKa at a timing T11. Further, the trigger signal ST rises with a delay from the timing T11, and a signal obtained by synthesizing the first test result signal S1 and the second test result signal S2, which are output at the timing T11, is stored in the storage section 17 as the synthesized test result signal. In this case, the data stored in the storage section 17 is at high level, since the first test result signal S1 is at high level and the second test result signal S2 is at low level.

After that, if the test target circuit 13*b* normally operates, the second test result signal S2 output from the test target circuit 13*b* rises in response to a rising edge of the operation clock CLKb at a timing T12. In the example shown in FIG. 3, however, a malfunction has occurred in the test target circuit 13*b*, and the second test result signal S2, which is supposed to rise, fails to rise. Further, the trigger signal ST rises with a delay from the timing T12, and a signal obtained by synthesizing the first test result signal S1 and the second test result signal S2, which are output at the timing T12, is stored in the storage section 17 as the synthesized test result signal. In this case, the data stored in the storage section 17 is at high level, since the first test result signal S1 is at high level and the second test result signal S2 is at low level.

Then, when a rising edge of the operation clock CLKa at a timing T13 is input, the first test result signal S1 output from the test target circuit 13*a* falls. Further, according to an exemplary embodiment of the present invention, the second test signal S2 output from the test target circuit 13*b* at the timing T13 is at high level. That is, the second test signal S2, which is supposed to rise at the timing T12, rises with a delay from the timing T12. Further, the trigger signal ST rises with a delay from the timing T13, and a signal obtained by synthesizing the first test result signal S1 and the second test result signal S2, which are output at the timing T13, is stored in the storage section 17 as the synthesized test result signal. In this case, the data stored in the storage section 17 is at high level, since the first test result signal S1 is at low level and the second test result signal is S2 at high level.

Then, the second test result signal S2 output from the test target circuit 13*b* falls in response to a rising edge of the operation clock CLKb at a timing T14. Further, the trigger signal ST rises with a delay from the timing T14, and a signal obtained by synthesizing the first test result signal S1 and the second test result signal S2, which are output at the timing 14, is stored in the storage section 17 as the synthesized test result signal. In this case, the data stored in the storage section 17 is at low level, since the first test result signal S1 is at low level and the second test result signal S2 is at low level.

After that, the synthesized test result signal stored in the storage section 17 is read out in response to the read instruction from the MPU 10, and is collated with an expected value prepared in advance. In this case, in the example shown in FIG. 3, the expected value does not match the synthesized test result signal during a period between the timing T12 and the timing T13, since the synthesized test result signal obtained during a period corresponding to the timing T11 to the timing T14 is at high level. Thus, if there is a period in which the expected value does not match the synthesized test result signal, it is determined that a malfunction has occurred in the test target circuit. Further, due to the fact that the first test result signal S1 is out of phase with the second test result signal S2, the test circuit according to an exemplary embodiment of the present invention can determine, based on the phase difference, that a malfunction has occurred in the test target circuit 13*b*.

As described above, the test circuit according to an exemplary embodiment of the present invention causes the test target circuits 13*a* and 13*b* to operate on the operation clocks having different phases, to thereby obtain the test result signals having different phases. Further, the test result signals having different phases are synthesized to obtain a single synthesized test result signal. Thus, even if multiple test result signals have the same logic, it is possible to determine whether the logical value of each of the test result signals to be output is correct or not, based on a single synthesized test result signal. Specifically, even if the logical values of the multiple test result signals are the same, a phase difference is produced between the test result signals, thereby obtaining the synthesized test result signal which becomes a high level signal during a period corresponding to the phase difference (when the synthesized test result signal is generated by an exclusive OR circuit). In other words, when a phase difference is produced between the multiple test result signals, it is possible to determine whether the logical value of each of the test result signals is correct or not based on the phase difference, by using a single synthesized test result signal. Note that, when the test target circuit outputs the test result signal through multiple signal lines, multiple synthesized test result signals are obtained. Further, the determination of the test result is made for each of the multiple synthesized test result signals.

Further, since a single synthesized test result signal is obtained by synthesizing the multiple test result signals, the test circuit according to an exemplary embodiment of the present invention is capable of reading the test results with a small number of terminals. Even in a case where the MPU 10 reads the synthesized test result signal obtained by the test circuit according to an exemplary embodiment of the present invention, it is only necessary to access the test circuit, without the need for polling or the like for adjusting a read timing. In view of the foregoing, the test circuit according to an exemplary embodiment of the present invention is capable of reading the test results in a short period of time in a system including a plurality of test target circuits.

Second Exemplary Embodiment

Figure 4:
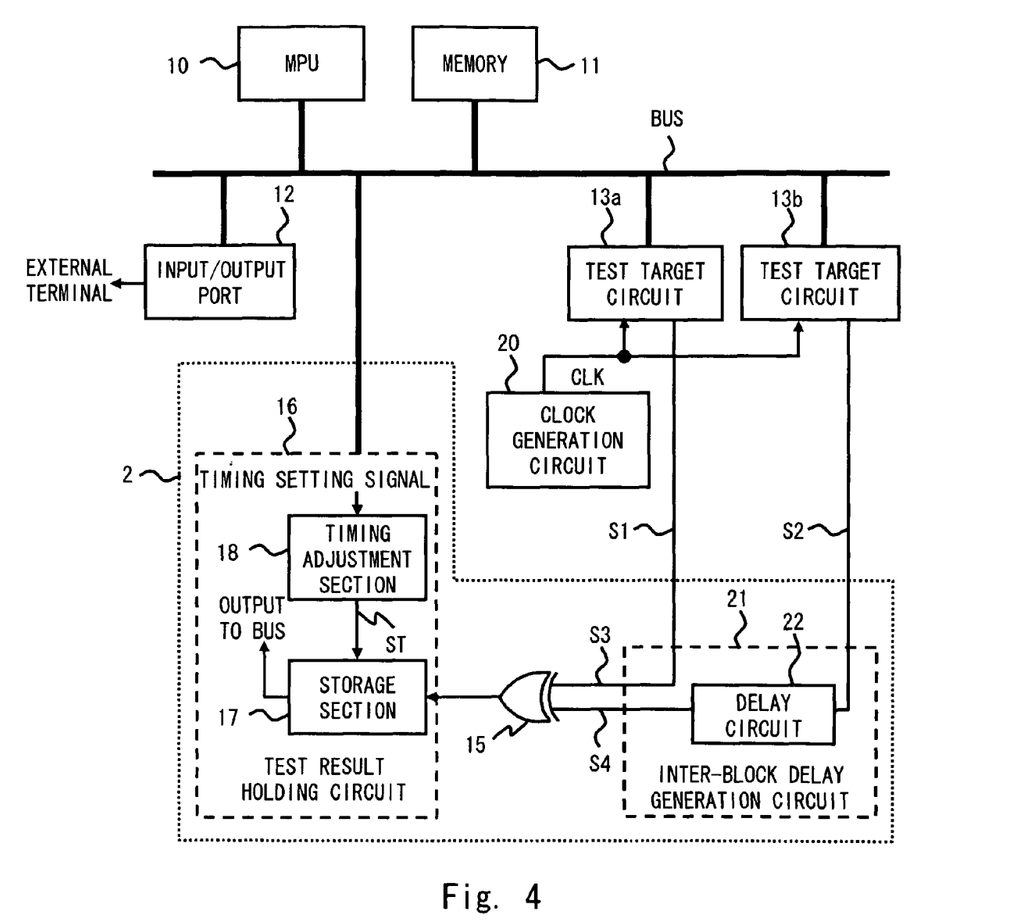
FIG. 4 is a block diagram of a semiconductor device according to a second exemplary embodiment of the present invention.

FIG. 4 shows a block diagram of a semiconductor device according to a second exemplary embodiment of the present invention. As shown in FIG. 4, according to the second exemplary embodiment of the present invention, the test target circuits 13*a* and 13*b* operate by receiving operation clocks having the same phase from a clock generation circuit 20. Thus, the first test result signal S1 is in phase with the second test result signal S2. Further, a test circuit 2 according to the second exemplary embodiment of the present invention includes an inter-block delay generation circuit 21 provided between the test target circuits 13*a* and 13*b* and the synthesis circuit 15. The inter-block delay generation circuit 21 includes a delay circuit 22 provided on a transmission path for transmitting the second test result signal S2. The inter-block delay generation circuit 21 outputs the first test result signal S1 directly as a first test result signal S3. Further, the inter-block delay generation circuit 21 causes the delay circuit 22 to delay the second test result signal S2, and outputs the delayed second test result signal S2 as a second test result signal S4.

The inter-block delay generation circuit 21 maintains a phase relation between the first test result signal S3 and the second test result signal S4 of the test circuit 2 the same as a phase relation between the first test result signal S1 and the second test result signal S2 of the test circuit 1. That is, also in the test circuit 2 according to the second exemplary embodiment of the present invention, the relation between the signals synthesized by the synthesis circuit 15 is the same as that of the test circuit 1 according to the first exemplary embodiment of the present invention. As a result, the synthesized test result signal similar to that of the test circuit 1 can be obtained also in the test circuit 2.

Third Exemplary Embodiment

Figure 5:
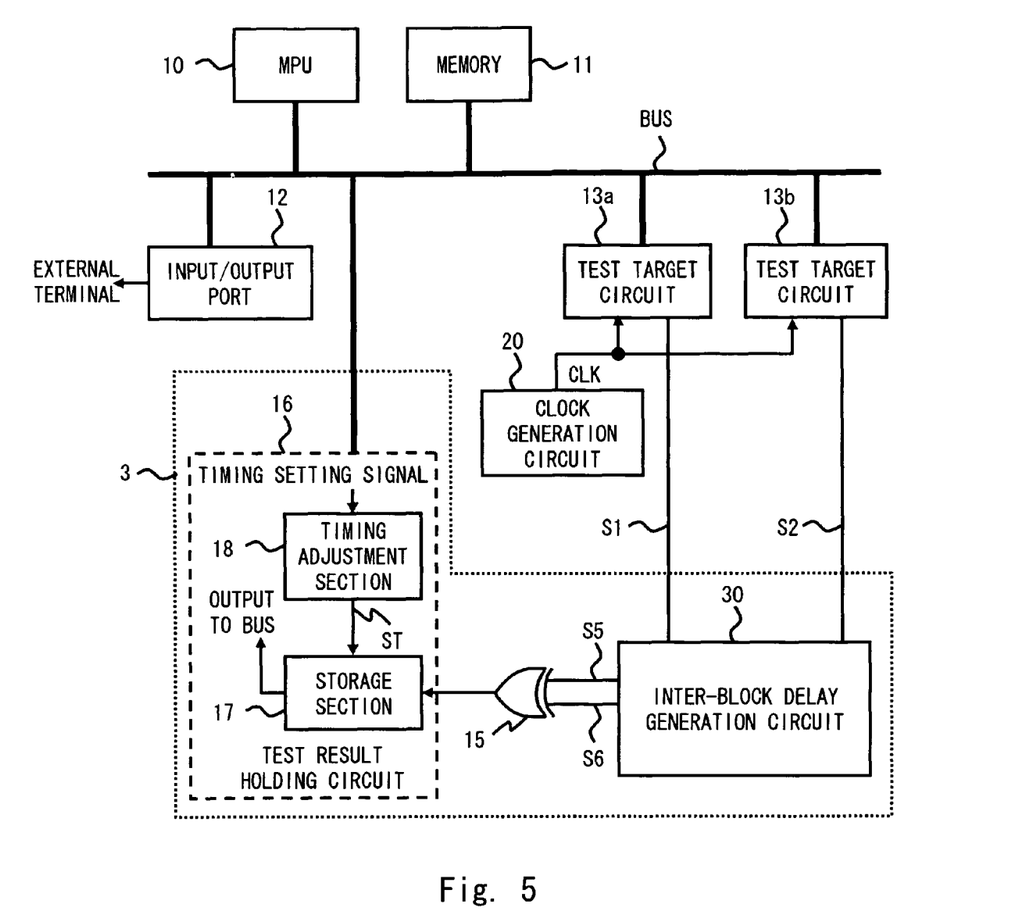
FIG. 5 is a block diagram of a semiconductor device according to a third exemplary embodiment of the present invention.

FIG. 5 shows a block diagram of a semiconductor device according to a third exemplary embodiment of the present invention. As shown in FIG. 5, the semiconductor device according to the third exemplary embodiment of the present invention includes a test circuit 3 as a modified example of the test circuit 2. An inter-block delay generation circuit 30 of the test circuit 3 generates a second test result signal S6 by delaying the second test result signal S2, when the rising edge or falling edge of the first test result signal S1 is in phase with the rising edge or falling edge of the second test result signal S2.

Figure 6:
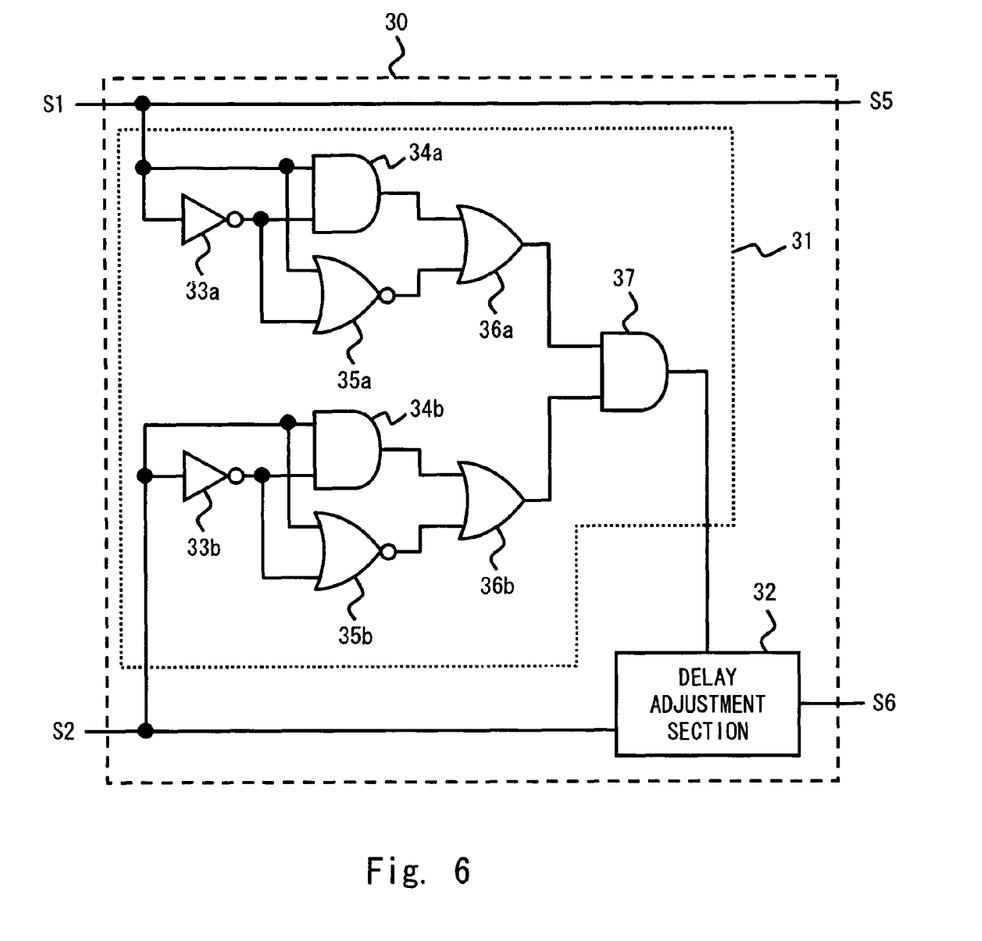
FIG. 6 is a block diagram of an inter-block delay generation circuit according to the third exemplary embodiment of the present invention.

FIG. 6 shows a specific block diagram of the inter-block delay generation circuit 30. As shown in FIG. 6, the inter-block delay generation circuit 30 includes an edge detection section 31 and a delay adjustment section 32. The edge detection section 31 detects whether the rising edge and the falling edge of the first test result signal S1 are synchronized with the rising edge and the falling edge of the second test result signal S2, and outputs an edge detection signal. When recognizing the determination result that the first test result signal is synchronized with the second test result signal based on the edge detection signal, the delay adjustment section 32 delays the second test result signal S2.

The edge detection section 31 includes inverters 33a and 33b, AND circuits 34a, 34b, and 37, NOR circuits 35a and 35b, and OR circuits 36a and 36b. Upon reception of the first test result signal S1, the inverter 33a outputs an inverted signal of the first test result signal S1. The inverter 33a also performs an operation for delaying the first test result signal S1. Upon reception of the first test result signal S1 and the output of the inverter 33a, the AND circuit 34a outputs the AND operation result of the two signals. Upon reception of the first test result signal S1 and the output of the inverter 33a, the NOR circuit 35a outputs the inverted OR operation result of the two signals. Upon reception of the output of the AND circuit 34a and the output of the NOR circuit 35a, the OR circuit 36a outputs the OR operation result of the two signals.

Upon reception of the second test result signal S2, the inverter 33b outputs an inverted signal of the second test result signal S2. The inverter 33b also performs an operation for delaying the second test result signal S2. Upon reception of the second test result signal S2 and the output of the inverter 33b, the AND circuit 34b outputs the AND operation result of the two signals. Upon reception of the second test result signal S2 and the output of the inverter 33b, the NOR circuit 35b outputs the inverted OR operation result of the two signals. Upon reception of the output of the AND circuit 34b and the output of the NOR circuit 35b, the OR circuit 36b outputs the OR operation result of the two signals.

Upon reception of the output of the OR circuit 36a and the output of the OR circuit 36b, the AND circuit 37 outputs the AND operation result of the two signals as the edge detection signal.

Figure 7:
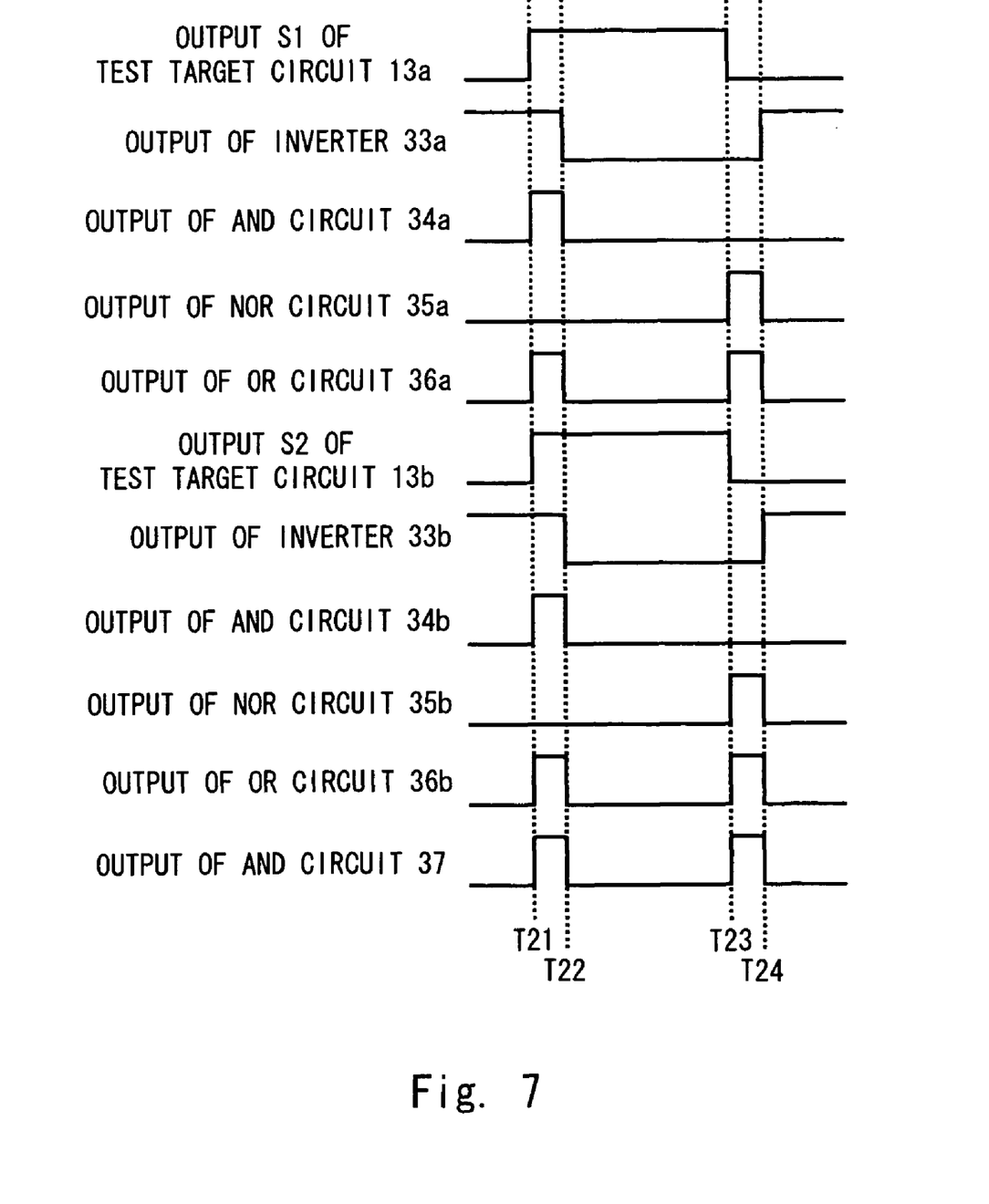
FIG. 7 is an example of a timing diagram showing an operation in the case where synchronized test result signals are input to an edge detection section according to the third embodiment of the present invention.

Referring now to FIG. 7, which shows an example of a timing diagram of an operation of the edge detection section 31, the operation of the edge detection section 31 is described below. According to an exemplary embodiment of the present invention, the test target circuits 13a and 13b operate on the same operation clock, and output synchronous test result signals. In this case, FIG. 7 shows the operation of the edge detection section 31 in the case where the first test result signal S1 is synchronized with the second test result signal S2.

In the example shown in FIG. 7, both the first test result signal S1 and the second test result signal S2 rise at a timing T21. Further, the first test result signal S1 and the second test result signal S2 respectively input to the inverters 33a and 33b fall at a timing T22 delayed from the timing T21. In this case, during a period between the timing T21 and the timing T22, two input signals of the AND circuits 34a and 34b are at high level, so the output of each of the AND circuits 34a and 34b is at high level. Meanwhile, during the period between the timing T21 and the timing T22, the output of each of the NOR circuits 35a and 35b is maintained at low level. Then, the output of the OR circuit 36a, which receives the output of the AND circuit 34a and the output of the NOR circuit 35a, becomes high level during the period between the timing T21 and the timing T22, based on the output of the AND circuit 34a. Further, the output of the OR circuit 36, which receives the output of the AND circuit 34b and the output of the NOR circuit 35b, becomes high level during the period between the timing T21 and the timing T22, based on the output of the AND circuit 34b. Furthermore, the output of each of the OR circuits 36a and 36b becomes high level during the period between the timing T21 and the timing T22, so the edge detection signal output from the AND circuit 37 during this period becomes high level.

Further, both the first test result signal S1 and the second test result signal S2 fall at a timing T23. Furthermore, the first test result signal S1 and the second test result signal S2 respectively input to the inverters 33a and 33b rise at a timing T24 delayed from the timing T23. In this case, during a period between the timing T23 and the timing T24, two input signals of the AND circuits 34a and 34b are at low level, so the output of each of the AND circuits 34a and 34b becomes low level. Meanwhile, during the period between the timing T23 and the timing T24, the output of each of the NOR circuits 35a and 35b is maintained at high level. Further, the output of the OR circuit 36a, which receives the output of the AND circuit 34a and the output of the NOR circuit 35a, becomes low level during the period between the timing T23 and the timing T24, based on the output of the NOR circuit 34a. The output of the OR circuit 36b, which receives the output of the AND circuit 34b and the output of the NOR circuit 35b, becomes high level during the period between the timing T23 and the timing T24, based on the output of the NOR circuit 34b. Furthermore, the output of each of the OR circuits 36a and 36b becomes high level during the period between the timing T23 and the timing T24, so the edge detection signal output from the AND circuit 37 during this period becomes high level.

As described above, the edge detection section 31 outputs the edge detection signal which has a rising edge synchronized with the edge of the test result signal, when the edge of the first test result signal S1 is synchronized with the edge of the second test result signal S2. Then, when recognizing that the first test result signal S1 is synchronized with the second test result signal S2 based on the edge detection signal, the delay adjustment section 32 outputs the second test result signal S6 obtained by delaying the second test result signal S2.

Figure 8:
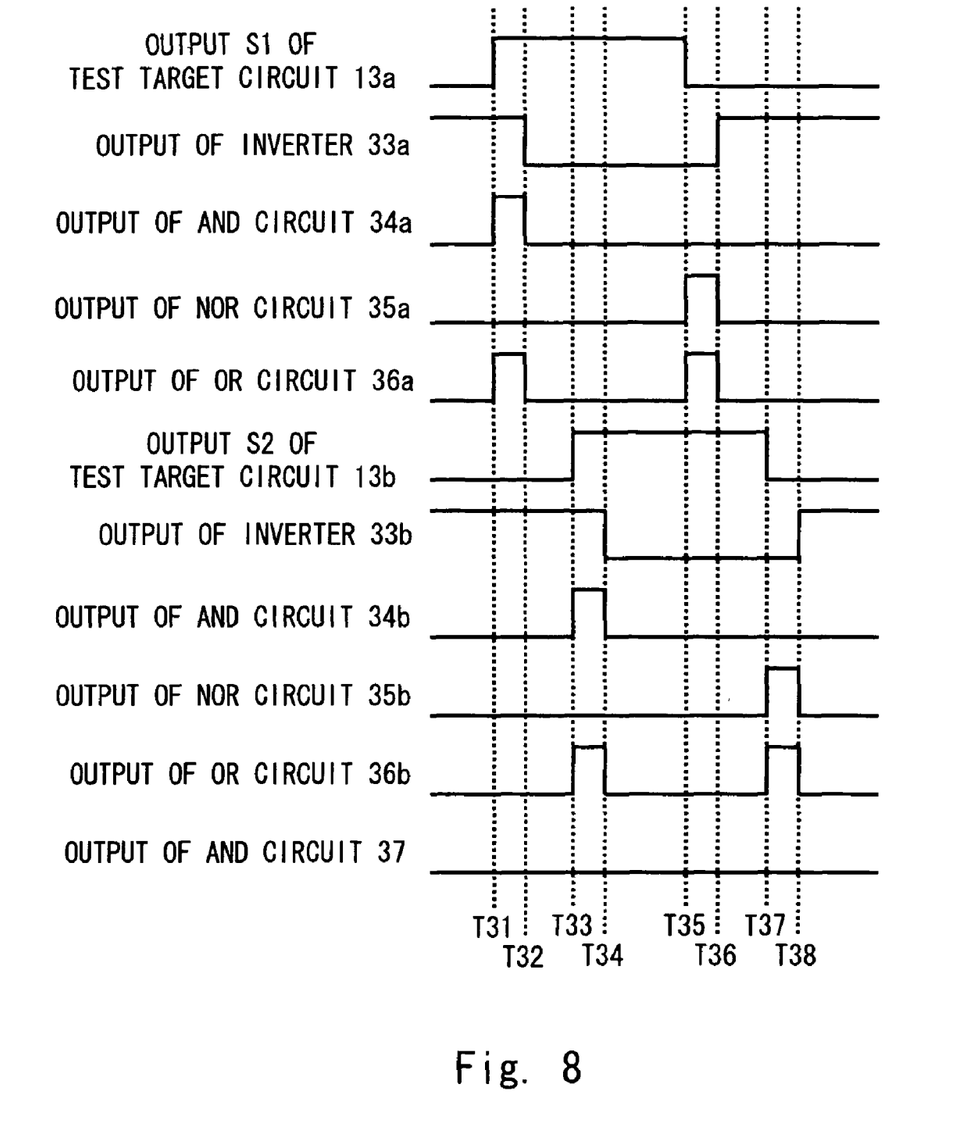
FIG. 8 is an example of a timing diagram showing an operation in the case where asynchronous test result signals are input to the edge detection section according to the third embodiment of the present invention.

As a reference example, FIG. 8 shows a timing diagram of an operation of the edge detection section 31 in the case where the first test result signal S1 is not synchronized with the second test result signal S2. FIG. 8 shows an example of using the first test result signal S1 and the second test result signal S2 which are output when the test target circuits 13a and 13b operate on independent asynchronous operation clocks. Note that, in FIG. 8, operations of gate circuits provided in the edge detection section 31 are the same as the operations described with reference to FIG. 7, so a description thereof is herein omitted.

In the example shown in FIG. 8, even when the edge of the first test result signal S1 is detected by the OR circuit 36a during a period between a timing T31 and a timing T32, the OR circuit 36b does not detect the edge of the second test result signal S2. As a result, the edge detection signal is maintained at low level. Even when the edge of the second test result signal S2 is detected by the OR circuit 36b during a period between a timing T33 and a timing T34, the OR circuit 36a does not detect the edge of the first test result signal S1. As a result, the edge detection signal is maintained at low level. Note that, also during a period between a timing T35 and a timing T36, the edge detection signal is maintained at low level as in the period during the timing T31 and the timing T32. Also during a period between a timing T37 and a timing T38, the edge detection signal is maintained at low level as in the period between the timing T33 and the timing T34.

In the example shown in FIG. 8, since the delay adjustment section 32 fails to recognize that the first test result signal S1 is synchronized with the second test result signal S2 based on the edge detection signal, the delay adjustment section 32 outputs the second test result signal S2 directly as the second test result signal S6 without delaying the second test result signal S2.

Though not illustrated in FIG. 6, a first delay circuit is desirably inserted at a position downstream from a node between a path for transmitting the first test result signal S1 as the first test result signal S5, and the edge detection section 31. Likewise, a second delay circuit is desirably inserted at a position which is downstream from a node between a path for transmitting the second test result signal S2 as the second test result signal S6, and the edge detection section 31, and which is upstream from the delay adjustment section 32. In this case, the first and second delay circuits add the same delay time to the signals. Switching of the delay time using the edge detection section 31 and the delay adjustment section 32 involves a delay in circuit operation. For this reason, the first delay circuit and the second delay circuit, which have delay times equal to or greater than the delay times generated in the edge detection section 31 and the delay adjustment section 32, respectively, are inserted. When the edge detection section 31 does not detect that the edge of the first test result signal S1 is synchronized with the edge of the second test result signal S2, the delay adjustment section 32 outputs the second test result signal S2 directly as the second test result signal S6. In this case, the first test result signal S5 is a signal obtained by delaying the first test result signal S1 by the delay time of the first delay circuit, and the second test result signal S6 is a signal obtained by delaying the second test result signal S2 by the delay time of the second delay circuit. When the edge detection section 31 detects that the edge of the first test result signal S1 is synchronized with the edge of the second test result signal S2, the delay adjustment section 32 further delays the signal obtained by delaying the second test result signal S2 by the delay time of the second delay circuit. In this case, the second test result signal S6 is a signal obtained by delaying the second test result signal S2 by using the second delay circuit and further delaying the resultant signal by using the delay adjustment section 32, that is, a signal obtained by delaying the first test result signal S5 by the delay time which is added by the delay adjustment section 32. Further, the timing for inputting the trigger signal ST is preferably set in consideration of the delay times generated by the first and second delay circuits.

As described above, the test circuit 3 according to the third exemplary embodiment of the present invention delays the second test result signal S2 when the rising edge of the first test result signal S1 is synchronized with the rising edge of the second test result signal S2. Thus, when the rising edge of the first test result signal S1 is synchronized with the rising edge of the second test result signal S2, the phase relation between the first result signal S5 and the second test result signal S6 of the test circuit 3 is the same as that of the test circuit 1. In other words, according to the third exemplary embodiment of the present invention, the test result signals input to the synthesis circuit 15 do not always have a phase difference. When the logical value of the first test result signal is equal to the logical value of the second test result signal, a phase difference is produced between the two test result signals. Thus, the test circuit 3 generates the synthesized test result signal based on which the test result signals from the two test target circuits can be individually determined.

Fourth Exemplary Embodiment

A fourth exemplary embodiment of the present invention shows a modified example of a determination method for the synthesized test result signal according to the first exemplary embodiment of the present invention. Since the synthesized test result signal according to the first exemplary embodiment of the present invention is a waveform signal corresponding to the test result, a time corresponding to the length of the waveform is required for reading. Meanwhile, according to the fourth exemplary embodiment of the present invention, the number of periods in which the high level of the synthesized test result signal is detected is calculated, and the calculation result is used as the test result.

Figure 9:
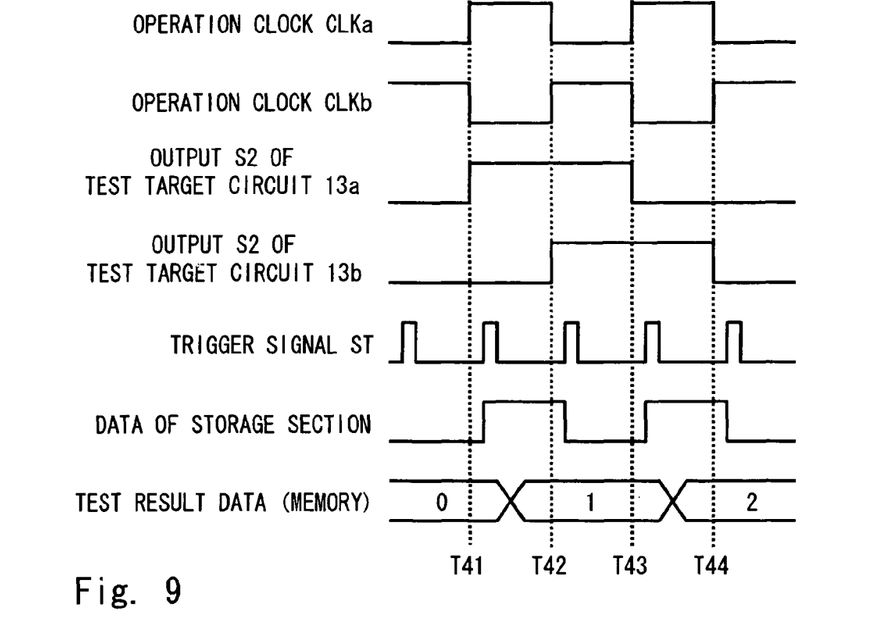
FIG. 9 is a timing diagram showing an operation of a test circuit according to a fourth exemplary embodiment of the present invention.

To provide a specific example, FIG. 9 shows a timing diagram of the test operation in the case where no malfunction has occurred in both the test target circuits 13a and 13b (that is, a timing diagram corresponding to the operation of FIG. 2 described according to the first exemplary embodiment of the present invention). Further, FIG. 10 shows a timing diagram of the test operation in the case where a malfunction has occurred in the test target circuit 13b (that is, a timing diagram corresponding to operation of FIG. 3 described according to the first exemplary embodiment of the present invention).

Figure 10:
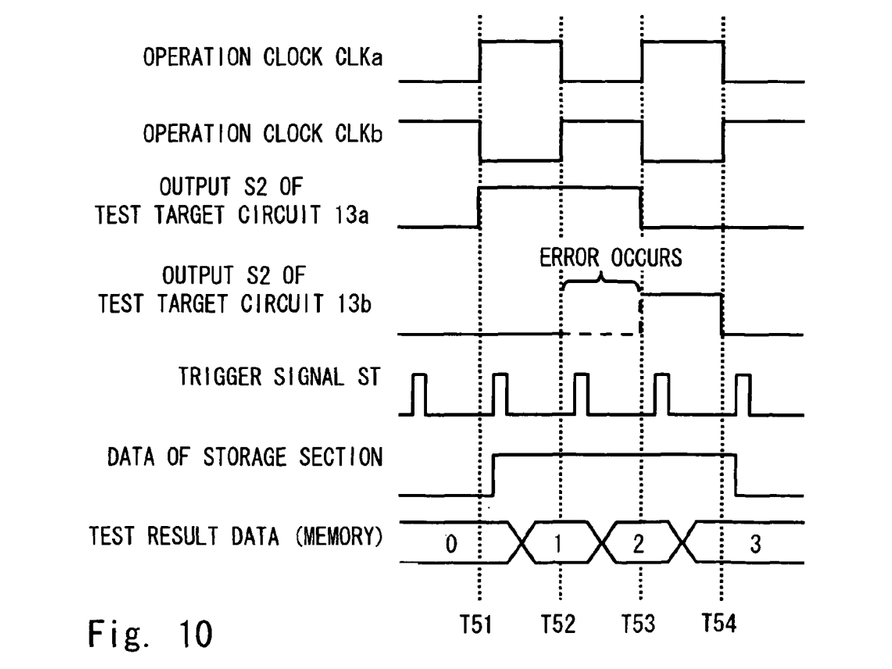
FIG. 10 is a timing diagram showing an operation of the test circuit according to the fourth exemplary embodiment of the present invention.

Referring to FIGS. 9 and 10, test results according to the fourth exemplary embodiment of the present invention are obtained by adding up (counting) the logical values of the synthesized test result signal, which are stored in the storage section 17, at each rising edge of the trigger signal ST. Thus, in the example in which no malfunction has occurred, as shown in FIG. 9, test result data indicates "2" at a timing T44 (that is, a timing corresponding to the timing T4 of FIG. 2). On the other hand, in the example in which a malfunction has occurred, as shown in FIG. 10, the test result data indicates "3" at a timing T54 (that is, a timing corresponding to the timing T14 of FIG. 3). In this case, the expected value is "2" at the timing T44 or T54. Accordingly, it is determined that a malfunction has occurred in the example shown in FIG. 10.

In this manner, instead of using the test results as waveform data of the synthesized test result signal, the test results are converted into readable data from the waveform data, thereby making it possible to substantially compress the test results. By reading the test result data thus compressed, the test results can be read at one time, which leads to a reduction in time for reading the test results.

The data compression may be performed before the data is stored in the storage section 17, or may be performed in accordance with a read operation of the MPU 10. In the examples shown in FIGS. 9 and 10, the data compression is performed together with the read operation of the MPU 10, and the compressed data is stored in the memory 11.

The first to fourth exemplary embodiments can be combined as desirable by one of ordinary skill in the art. For example, in place of the exclusive OR circuit, another synthesis algorithm can be applied to the synthesis circuit 15.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A test circuit, comprising:
    a synthesis circuit that synthesizes a first test result signal output from a first test target circuit in response to a test instruction, and a second test result signal output from a second test target circuit in response to the test instruction;
    an inter-block delay generation circuit that delays the second test result signal with respect to the first test result signal; and
    a test result holding circuit that holds a synthesized test result signal every predetermined timing, the synthesized test result signal being output from the synthesis circuit.

2. The test circuit according to claim 1, wherein the inter-block delay generation circuit supplies an operation clock delayed from an operation clock for the first test target circuit, to the second test target circuit.

3. The test circuit according to claim 1, wherein the inter-block delay generation circuit outputs the second test result signal delayed from the first test result signal.

4. The test circuit according to claim 3, wherein the inter-block delay generation circuit delays and outputs the second test result signal when one of a rising edge and a falling edge of the first test result signal is synchronized with one of a rising edge and a falling edge of the second test result signal.

5. The test circuit according to claim 1, wherein the inter-block delay generation circuit delays and outputs the second test result signal when one of a rising edge and a falling edge of the first test result signal is synchronized with one of a rising edge and a falling edge of the second test result signal.

6. The test circuit according to claim 1, wherein the test result holding circuit counts the synthesized test result signal every predetermined timing, and holds a count value.

7. The test circuit according to claim 1, wherein the synthesis circuit outputs an exclusive OR of the first test result signal and the second test result signal, as the synthesized test result signal.

8. The test circuit according to claim 1, wherein the first test target circuit and the second test target circuit output the same test result signal in response to the same test instruction.

9. The test circuit according to claim 1, wherein the test instruction is output from an arithmetic section connected with each of the first test target circuit and the second test target circuit.

10. The test circuit according to claim 1, wherein the first test target circuit and the second test target circuit are provided separately from a circuit comprising a scan chain circuit.

11. The test circuit according to claim 2, wherein the first test target circuit and the second test target circuit output the same test result signal in response to the same test instruction.

12. The test circuit according to claim 3, wherein the first test target circuit and the second test target circuit output the same test result signal in response to the same test instruction.

13. The test circuit according to claim 4, wherein the first test target circuit and the second test target circuit output the same test result signal in response to the same test instruction.

14. The test circuit according to claim 5, wherein the first test target circuit and the second test target circuit output the same test result signal in response to the same test instruction.

15. The test circuit according to claim 6, wherein the first test target circuit and the second test target circuit output the same test result signal in response to the same test instruction.

* * * * *